US011460898B2

(12) United States Patent
Ping

(10) Patent No.: US 11,460,898 B2
(45) Date of Patent: *Oct. 4, 2022

(54) ADVANCED THERMAL CONTROL FOR SSD

(71) Applicant: Samsung Electronics Co., Ltd., Suwon-si (KR)

(72) Inventor: Zhan Ping, Milpitas, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/894,572

(22) Filed: Jun. 5, 2020

(65) Prior Publication Data

US 2020/0301489 A1    Sep. 24, 2020

Related U.S. Application Data

(63) Continuation of application No. 15/659,538, filed on Jul. 25, 2017, now Pat. No. 10,698,460.

(60) Provisional application No. 62/470,828, filed on Mar. 13, 2017.

(51) Int. Cl.
*G06F 1/20* (2006.01)
*H05K 7/20* (2006.01)
*G11B 33/14* (2006.01)

(52) U.S. Cl.
CPC ............ *G06F 1/206* (2013.01); *G11B 33/142* (2013.01); *H05K 7/20209* (2013.01); *H05K 7/20836* (2013.01)

(58) Field of Classification Search
CPC ... G06F 1/206; G11B 33/142; H05K 7/20209; H05K 7/20836; Y02D 10/00
See application file for complete search history.

(56) References Cited

U.S. PATENT DOCUMENTS

| | | |
|---|---|---|
| 5,307,477 A | 4/1994 | Taylor et al. |
| 5,461,699 A | 10/1995 | Arbabi et al. |
| 5,560,816 A | 10/1996 | Robinson |
| 5,574,827 A | 11/1996 | Wang |

(Continued)

FOREIGN PATENT DOCUMENTS

| | | |
|---|---|---|
| CN | 1725131 A | 1/2006 |
| CN | 103092229 B | 4/2015 |

(Continued)

OTHER PUBLICATIONS

Jingqing Han; From PID to Active Disturbance Rejection Control, Mar. 3, 2009, IEEE, p. 900-906 (Year: 2009).

(Continued)

*Primary Examiner* — Kidest Bahta
(74) *Attorney, Agent, or Firm* — Lewis Roca Rothgerber Christie LLP

(57) ABSTRACT

A storage system with temperature control. The system includes a plurality of storage devices such as solid state drives, a system controller such as a baseboard management controller, and one or more cooling fans. Each storage devices includes a controller configured to estimate the heat load in the storage device and/or an effective temperature, resulting from operations performed in the storage device. The system controller employs active disturbance rejection control to adjust the fan speed based on the estimated heat loads, the estimated temperatures, and/or the sensed internal temperatures, of the storage devices.

20 Claims, 8 Drawing Sheets

(56) References Cited

U.S. PATENT DOCUMENTS

| | | | |
|---|---|---|---|
| 5,906,821 A * | 5/1999 | Griffin | A61P 37/04 |
| | | | 424/229.1 |
| 6,021,076 A | 2/2000 | Woo et al. | |
| 7,587,572 B1 | 9/2009 | Stenstrom | |
| 8,060,340 B2 | 11/2011 | Gao et al. | |
| 8,341,380 B2 | 12/2012 | Deming et al. | |
| 8,392,928 B1 | 3/2013 | Forys et al. | |
| 8,590,332 B2 | 11/2013 | Wyatt | |
| 8,644,963 B2 | 2/2014 | Gao et al. | |
| 9,313,929 B1 | 4/2016 | Malone et al. | |
| 9,342,443 B2 | 5/2016 | Walker et al. | |
| 9,355,024 B2 | 5/2016 | Nguyen et al. | |
| 9,430,328 B2 | 8/2016 | Conte et al. | |
| 9,709,965 B2 | 7/2017 | Slessman et al. | |
| 10,250,673 B1 | 4/2019 | Brooker et al. | |
| 2004/0093315 A1 | 5/2004 | Carney | |
| 2007/0266391 A1* | 11/2007 | Hoffman | G06F 11/3419 |
| | | | 718/106 |
| 2010/0085196 A1 | 4/2010 | Stiver et al. | |
| 2010/0259998 A1 | 10/2010 | Kwon et al. | |
| 2011/0054714 A1* | 3/2011 | Santos | G05D 23/19 |
| | | | 700/299 |
| 2011/0279967 A1 | 11/2011 | Claassen et al. | |
| 2012/0023492 A1 | 1/2012 | Govindan et al. | |
| 2012/0095719 A1 | 4/2012 | Araki et al. | |
| 2012/0218707 A1 | 8/2012 | Chan | |
| 2012/0283850 A1 | 11/2012 | Gao et al. | |
| 2012/0283881 A1 | 11/2012 | Federspiel | |
| 2013/0030785 A1 | 1/2013 | Satterfield et al. | |
| 2013/0080680 A1 | 3/2013 | Chu | |
| 2013/0098599 A1 | 4/2013 | Busch et al. | |
| 2013/0138876 A1 | 5/2013 | Wang | |
| 2013/0290972 A1 | 10/2013 | Cherkasova et al. | |
| 2014/0101371 A1 | 4/2014 | Nguyen et al. | |
| 2014/0195013 A1 | 7/2014 | Gao et al. | |
| 2014/0201477 A1 | 7/2014 | Greenfield et al. | |
| 2014/0201741 A1 | 7/2014 | Govindan et al. | |
| 2015/0205714 A1 | 7/2015 | Greenfield et al. | |
| 2015/0277762 A1 | 10/2015 | Guo et al. | |
| 2015/0324135 A1 | 11/2015 | Chan et al. | |
| 2016/0033944 A1 | 2/2016 | El-Shaer et al. | |
| 2016/0086654 A1 | 3/2016 | Arora et al. | |
| 2016/0209816 A1 | 7/2016 | Neundorfer | |
| 2016/0224381 A1 | 8/2016 | Farhan et al. | |
| 2016/0259575 A1 | 9/2016 | Hikimura et al. | |

FOREIGN PATENT DOCUMENTS

| | | |
|---|---|---|
| CN | 103643027 B | 8/2015 |
| CN | 106292273 A | 1/2017 |
| CN | 106444419 A | 2/2017 |
| JP | 3058867 B2 | 7/2000 |
| JP | 2009-257617 A | 11/2009 |
| KR | 10-1775454 | 9/2017 |

OTHER PUBLICATIONS

HUANG Yi et al., Active Disturbance Rejection Control, Jul. 30, 2014, Chinese control conference , p. 1-96. (Year: 2014).

Wu et al., "Exploiting Heat-Accelerated Flash Memory Wear-Out Recovery to Enable Self-Healing SSDs," HotStorage, 2011, 5 pages, Internet URL: http://static.usenix.org/legacy/events/hotstorage11/tech/final_files/Wu.pdf.

Office action issued in U.S. Appl. No. 15/961,782 by the USPTO, dated Aug. 28, 2019, 8 pages.

U.S. Notice of Allowance from U.S. Appl. No. 15/659,538, dated Feb. 20, 2020, 7 pages.

U.S. Notice of Allowance from U.S. Appl. No. 15/961,782, dated Jun. 5, 2020, 7 pages.

U.S. Office Action from U.S. Appl. No. 15/659,538, dated Jul. 22, 2019, 4 pages.

U.S. Office Action from U.S. Appl. No. 15/659,538, dated May 9, 2019, 13 pages.

U.S. Office Action from U.S. Appl. No. 15/659,538, dated Nov. 29, 2018 14 pages.

U.S. Office Action from U.S. Appl. No. 15/659,538, dated Sep. 17, 2019, 12 pages.

U.S. Office Action from U.S. Appl. No. 15/961,782, dated Aug. 28, 2019, 9 pages.

U.S. Office Action from U.S. Appl. No. 15/961,782, dated Jan. 16, 2020, 9 pages.

U.S. Office Action from U.S. Appl. No. 17/030,193, dated Apr. 26, 2022, 11 pages.

Zheng, Qing, "On Active Disturbance Rejection Control: Stability Analysis and Applications in Disturbance Decoupling Control", Dissertation for the Department of Electrical and Computer Engineering, Cleveland State University, Jul. 2009, 102 pages.

Zheng, Qinling et al., "Active Disturbance Rejection Control for Server Thermal Management", 2018 5th International Conference on Control, Decision and Information Technologies, Apr. 10-13, 2018, pp. 158-163, IEEE Xplore.

* cited by examiner

FIG. 5C  $\ddot{y}=(-a_1\dot{y}-a_0 y+d)+bu$

FIG. 5D  $\ddot{y}=f(y,\dot{y},\ddot{y},d,t)+bu$

FIG. 5E  $u=u_0-\dfrac{\hat{f}}{b}$

FIG. 5F  $\hat{f}\approx f$

FIG. 5G  $\ddot{y}\approx bu_0$

*FIG. 5H*

$$\ddot{y} = f(y, \dot{y}, w, t) + u \Rightarrow$$

$$x_1 = y, x_2 = \dot{y}, x_3 = \ddot{y}, x_3 = f(y, \dot{y}, w, t)$$

$$\begin{cases} \dot{x}_1 = x_2 \\ \dot{x}_2 = x_3 + u \\ \dot{x}_3 = \dot{f} \\ y = x_1 \end{cases}$$

*FIG. 5I*

$$\begin{cases} \dot{z}_1 = z_2 - \beta_1(z_1 - y) \\ \dot{z}_2 = z_3 - \beta_2(z_1 - y) + u \\ \dot{z}_3 = -\beta_3(z_1 - y) \end{cases} \longrightarrow$$

$$z_1 \approx x_1 \quad z_2 \approx x_2 \quad z_3 \approx x_3 = f$$

ADVANCED THERMAL CONTROL FOR SSD

CROSS-REFERENCE TO RELATED APPLICATION(S)

This application is a continuation of U.S. patent application Ser. No. 15/659,538, filed on Jul. 25, 2017, which claims priority to and the benefit of U.S. Provisional Application No. 62/470,828, filed on Mar. 13, 2017, entitled "ADRC (ACTIVE DISTURBANCE REJECTION) HIGH EFFICIENT THERMAL CONTROL FOR NVME SSD AND SYSTEM", the entire content of both of which is incorporated by reference herein.

FIELD

One or more aspects of embodiments according to the present invention relate to persistent storage systems, and more particularly to temperature control for a persistent storage system.

BACKGROUND

Thermal control of persistent storage devices such as solid state drives (SSDs) may be an important feature of a persistent storage system, affecting, for example, the data lifetime of data stored in flash memory, and potentially affecting power consumption. Some related art systems may control the temperatures of SSDs in a persistent storage system by feeding back from temperature sensors in the respective SSDs to cooling fans, through one or more proportional integral differential (PID) controllers. Such a system may have relatively poor performance, with, for example, the cooling adjustment lagging significantly behind any temperature increase, and with coupling between the control loops for the SSDs potentially degrading performance as well.

Thus, there is a need for an improved temperature control system for a persistent storage system.

SUMMARY

Aspects of embodiments of the present disclosure are directed toward a storage system with temperature control. The system includes a plurality of storage devices such as solid state drives, a system controller such as a baseboard management controller, and one or more cooling fans. Each storage devices includes a controller configured to estimate the heat load in the storage device and/or an effective temperature, resulting from operations performed in the storage device. The system controller employs active disturbance rejection control to adjust the fan speed based on the estimated heat loads, the estimated temperatures, and/or the sensed internal temperatures, of the storage devices.

According to an embodiment of the present invention there is provided a storage system, including: a plurality of storage devices; a cooling fan; and a system management processing circuit, the system management processing circuit being configured to: measure a workload of one or more of the storage devices, and adjust a speed of the cooling fan based on the measured workload.

In one embodiment, the system management processing circuit is configured to adjust the speed of the cooling fan utilizing active disturbance rejection control.

In one embodiment, each of the storage devices is a solid state drive.

In one embodiment, each storage device includes a storage device processing circuit, configured with the system management processing circuit to adjust the speed of the cooling fan based on the measured workload.

In one embodiment, the storage device processing circuit of a first storage device of the plurality of storage devices is configured to estimate a power dissipated in the first storage device.

In one embodiment, the storage device processing circuit of the first storage device is configured to estimate an effective temperature in the first storage device.

In one embodiment, the storage device processing circuit is configured to implement an artificial neural network, the artificial neural network being configured to receive information regarding a rate at which nonvolatile memory operations are performed in the storage device, and to estimate the effective temperature in the first storage device.

In one embodiment, the artificial neural network includes an input layer, a hidden layer, and an output layer.

In one embodiment, the input layer includes at least three nodes and at most four nodes.

In one embodiment, the hidden layer includes a first hidden sub-layer and a second hidden sub-layer.

In one embodiment, the first hidden sub-layer includes at least four nodes and at most five nodes.

In one embodiment, the second hidden sub-layer includes at least four nodes and at most five nodes.

In one embodiment, the output layer includes a first output node and a second output node.

In one embodiment, an output of the first output node is an estimated heat load and an output of the second output node is an estimated effective temperature.

In one embodiment, the storage includes the estimated effective temperature in the first storage device, and to generate, based on the plurality of estimated effective temperatures, a plurality of fan speed commands.

In one embodiment, the system management processing circuit is configured to generate the plurality of fan speed commands utilizing active disturbance rejection control.

According to an embodiment of the present invention there is provided a method for operating a storage system, the storage system including: a plurality of storage devices; a cooling fan; and a system management processing circuit, the method including: measuring a workload of one or more of the storage devices, and adjusting a speed of the cooling fan based on the measured workload.

In one embodiment, the adjusting of the speed of the cooling fan includes: estimating, utilizing an artificial neural network, a heat load corresponding to the measured workload; estimating an effective temperature of a storage device of the plurality of storage devices; and generating a fan speed command utilizing active disturbance rejection control.

In one embodiment, the method includes training the neural network when the storage system is off line.

According to an embodiment of the present invention there is provided a storage system, including: a plurality of storage devices; a cooling fan; and processing means, the processing means being configured to: measure a workload of one or more of the storage devices, and adjust a speed of the cooling fan based on the measured workload.

BRIEF DESCRIPTION OF THE DRAWINGS

These and other features and advantages of the present invention will be appreciated and understood with reference to the specification, claims, and appended drawings wherein:

FIG. 5C is an equation employed in active disturbance rejection control, according to an embodiment of the present invention;

FIG. 5D is an equation employed in active disturbance rejection control, according to an embodiment of the present invention;

FIG. 5E is an equation employed in active disturbance rejection control, according to an embodiment of the present invention;

FIG. 5F is an equation employed in active disturbance rejection control, according to an embodiment of the present invention;

FIG. 5G is an equation employed in active disturbance rejection control, according to an embodiment of the present invention;

FIG. 5H is an equation employed in active disturbance rejection control, according to an embodiment of the present invention;

FIG. 5I is an equation employed in active disturbance rejection control, according to an embodiment of the present invention.

DETAILED DESCRIPTION

The detailed description set forth below in connection with the appended drawings is intended as a description of exemplary embodiments of a system and method for thermal control for SSD provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

In some embodiments, a storage system includes a plurality of SSDs 110 in an enclosure 120. The enclosure may be cooled by a plurality of cooling fans 130. The speed of each cooling fan 130 may be controlled by a controller, e.g., a baseboard management controller (or "system management processing circuit") (BMC) 140. In some embodiments, the baseboard management controller 140 has information about the temperature of each of the SSDs 110 (as discussed in further detail below) and adjusts the respective speeds of the cooling fans 130 so that the temperature of each SSD 110 is kept within an acceptable range without consuming more fan power than necessary. In addition, the new control method will perform a faster cooling adjustment before temperature make major changes to keep the thermal cooling quick and smooth, which also means saving extra power.

Figure 1:
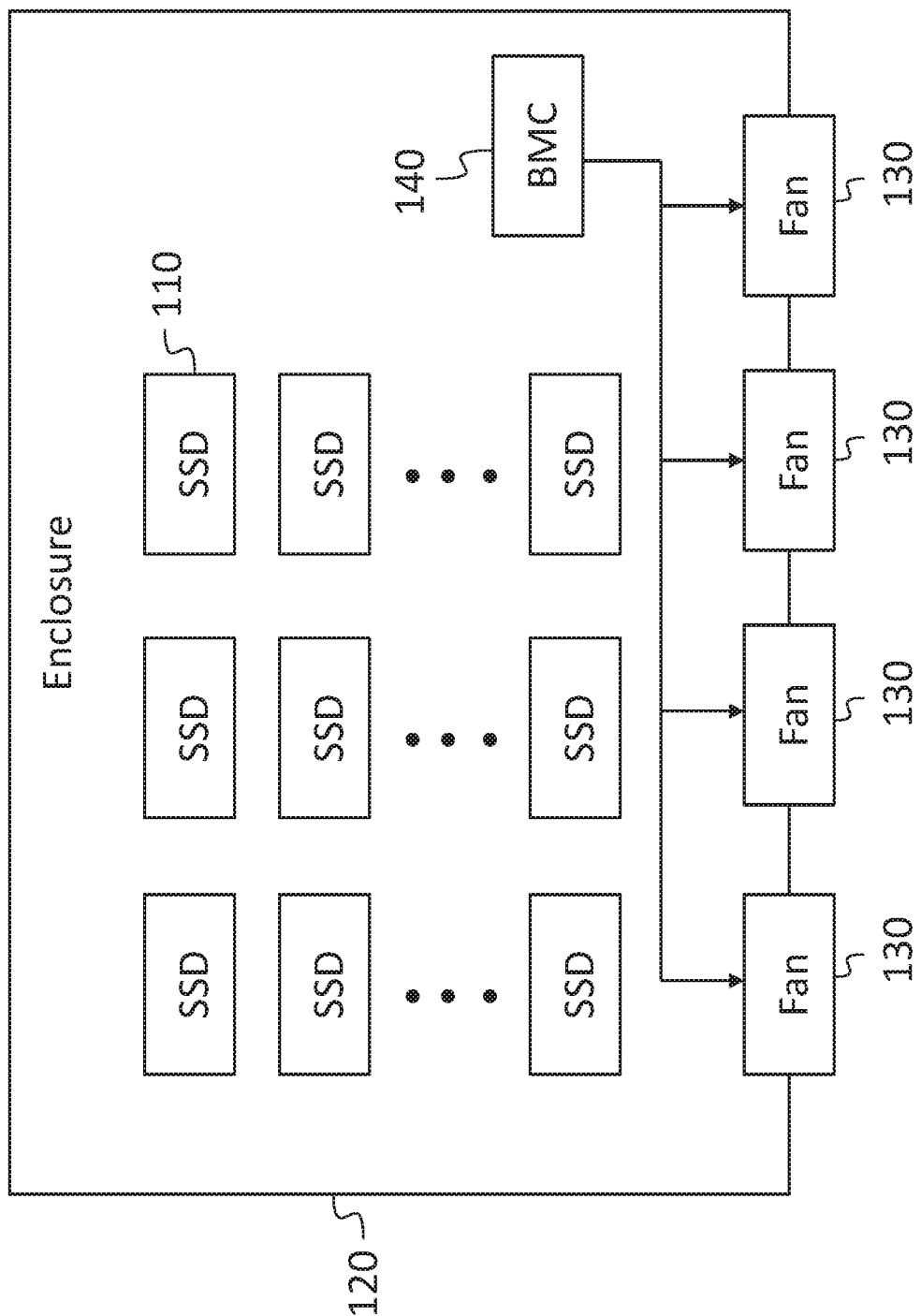
FIG. 1 is a block diagram of a storage system, according to an embodiment of the present invention.
Figure 2:
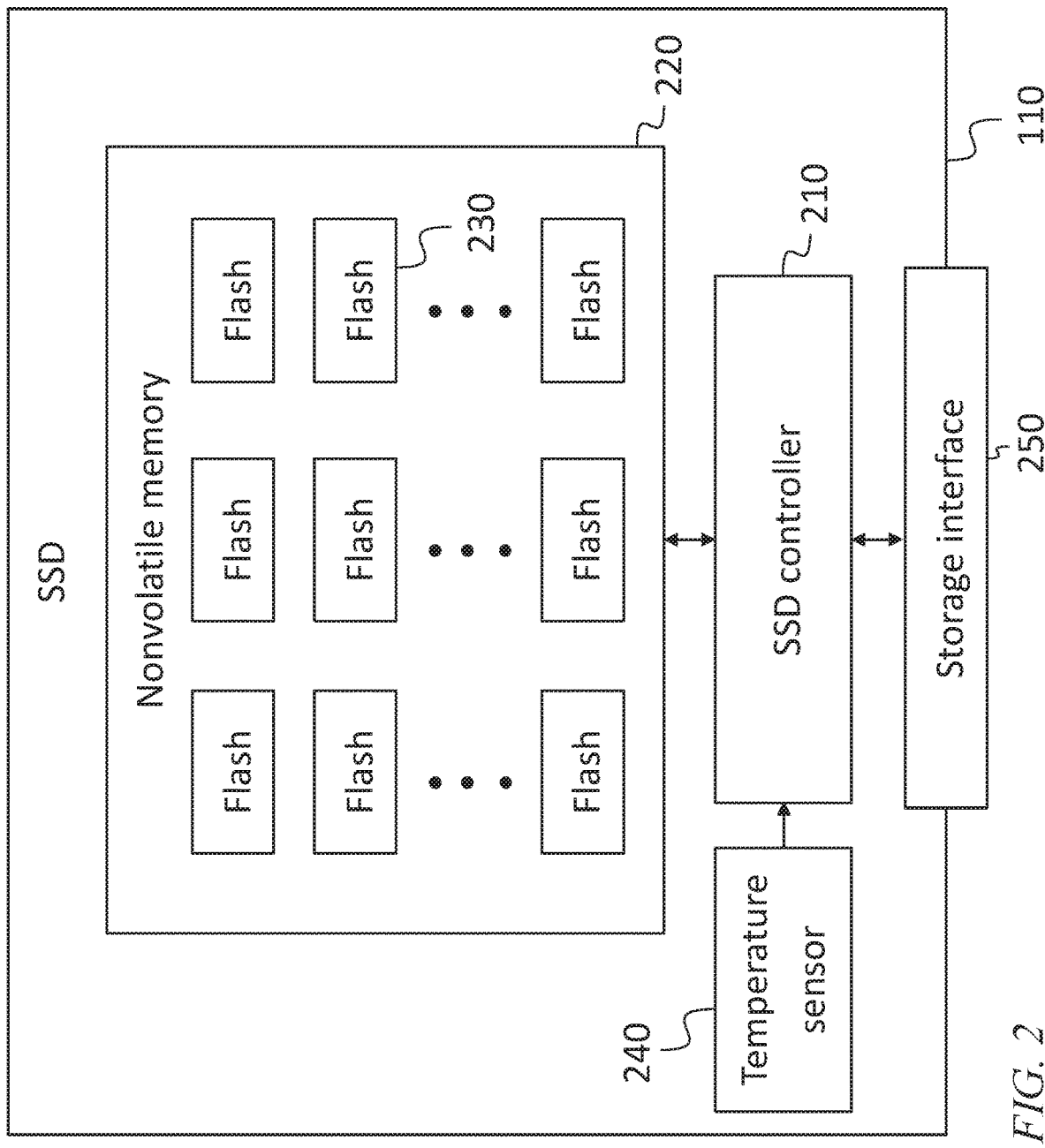
FIG. 2 is a block diagram of a storage device, according to an embodiment of the present invention.

Referring to FIG. 2, in some embodiments each SSD includes an SSD controller 210 (or "storage device processing circuit"), a nonvolatile memory 220 including (e.g., consisting of) a plurality of flash chips 230, an internal temperature sensor 240, and a storage interface 250. In some embodiments, the storage device conforms to a 3.5 inch hard drive form-factor (or large form factor (LFF)) standard. In other embodiments it conforms to a 2.5 inch hard drive form-factor (or small form factor (SFF)) standard. The storage interface 250 may include a connector and a protocol customarily used by a host external to the enclosure and storage device to exchange storage requests and responses. The connector and protocol may conform to, for example, Peripheral Component Interconnect Express (PCIe), remote direct memory access (RDMA) over Ethernet, Serial Advanced Technology Attachment (SATA), Fibre Channel, Serial Attached SCSI (SAS), Non Volatile Memory Express (NVMe), or to a more general-purpose interface such as Ethernet or Universal Serial Bus (USB). The storage interface 250 is used by the host to communicate with the storage device. Input output (TO) requests such as data read and data write requests, as well as various media management requests (e.g., Identify, Get Log, etc.) may be sent to the storage device by the host over the storage interface 250. The same interface may be used by the storage device to perform data transfers to and from internal memory in the host.

In operation, each SSD may receive (e.g., from the host), and execute, input or output commands (TO commands) such as read commands, write commands, and erase commands. The executing of these commands may involve flash memory operations (e.g., read, write, or erase operations on the flash memory) in the SSD. The SSD may also on occasion conduct garbage collection operations to consolidate valid data and erase blocks in which a significant proportion of the data are not valid.

In some embodiments, the baseboard management controller 140 is connected to each SSD and configured to read the temperature sensors 240. Each measured temperature may be subtracted from a respective temperature setpoint (e.g., a temperature within the range (e.g., at the center of the range)) of acceptable operating temperatures to form a respective error signal. In related art embodiments, the baseboard management controller 140 implements one or more PID controllers, each of which receives an error signal, and generates an output that is used to control the fan speed. PID controllers may, however exhibit relatively poor performance in the presence of fluctuating heat loads. Such fluctuating heat loads may be the result, for example, of fluctuating workloads in one or more of the SSDs. For example, the operations performed by the SSD may consume power, and the rate at which the SSD executes such operations (e.g., in response to commands from an external host) may affect the power dissipated in the SSD 110, which may in turn contribute to the heat load on the SSD. Other factors, such as the temperature external to the enclosure 120, and power dissipated in other SSDs, may also affect the heat load on any SSD 110. As used herein, the "workload" of a storage device refers to the actual rate at which it executes storage operations, e.g., read operations, write operations, and erase operations.

In some embodiments, the baseboard management controller 140, instead of using only temperature measurements from the SSDs 110, may use a measure of the workload of each SSD 110 as an input to a temperature control method. The baseboard management controller 140 may monitor the workload by monitoring the input and output commands received by each SSD and forming an estimate of the total workload of each SSD. The workload may be quantified in various ways, e.g., as a rate at which operations are being performed (e.g., a number of operations per unit time), or a weighted average of rates of different kinds of operations, weighted according to the energy each kind of operation dissipates in the SSD. For example, if a write operation consumes five times as much energy as a read operation (and assuming that most or all of the energy consumed is dissipated, as opposed to being stored as potential energy, e.g., as charge on a floating gate), then the workload may be characterized as one sixth of the rate at which read operations are performed plus five sixths of the rate at which write operations are performed. In other embodiments, the measure of the workload may be a function of the kinds of operations performed, and also of their size, e.g., the number of bytes read or written.

Figure 3:
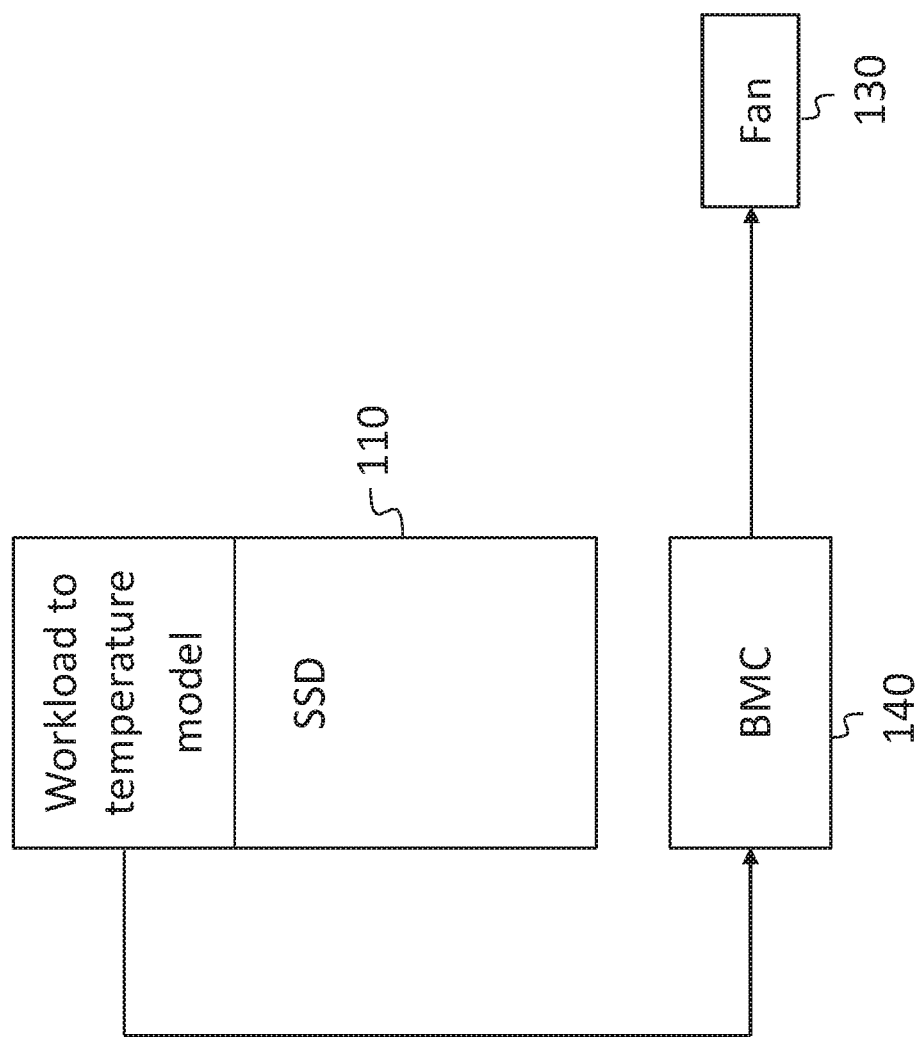
FIG. 3 is a block diagram of a system and method for cooling, according to an embodiment of the present invention.

Referring to FIG. 3, in some embodiments the SSD controller 210 generates a heat load estimate. The SSD controller 210 may control and monitor all flash memory operations, including garbage collection, and it may form a workload estimate and/or a heat load estimate as a result. In some embodiments, as described above for the baseboard management controller 140, the SSD controller 210 calculates an effective workload as a weighted average of flash memory read operations and flash memory write operations, including any flash memory read operations and flash memory write operations used for garbage collection (weighting write operations, e.g., five times as heavily as read operations), and estimates a heat load as being proportional to the effective workload. The SSD controller 210 may also calculate an effective temperature, e.g., equal to the product of (i) the ratio of the heat load to the thermal mass of the SSD and (ii) a response time of the set of cooling fans 130.

Figure 4:
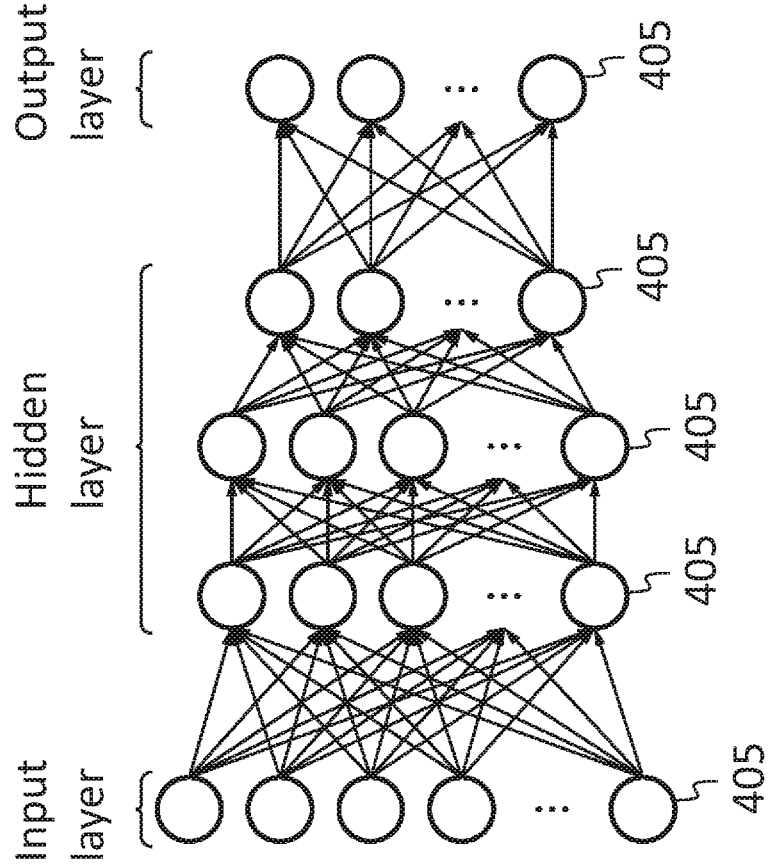
FIG. 4 is a schematic diagram of an artificial neural network, according to an embodiment of the present invention.

Referring to FIG. 4, in some embodiments, a neural network (or "artificial neural network") is used to estimate the heat load in the SSD. The neural network may be implemented as a suitable set of program instructions executed by the SSD controller 210 or by the baseboard management controller 140, or it may be implemented as an analog neural network configured, with suitable digital to analog and analog to digital converters, to operate as an (on-chip or off-chip) analog co-processor of the SSD controller 210 or of the baseboard management controller 140. The neural network may have an input layer, a hidden layer, and an output layer, each including a plurality of nodes 405, or "artificial neurons", connected together in a network, as shown. Each node 405 is connected with a plurality of other nodes 405, and links between the nodes 405 may be configured (by training, discussed in further detail below) to enhance or inhibit an activation state of adjoining nodes 405. Each individual node 405 may execute a summation function, summing inputs received from the outputs of other nodes 405. There may be a threshold function or limiting function in each node 405, such that the calculated sum must surpass a set limit before propagating to other nodes 405. In some embodiments, the input layer includes three or four nodes (i.e., it includes at least three nodes and at most four nodes), the hidden layer includes a first hidden sub-layer including four or five nodes and a second hidden sub-layer including four or five nodes and the output layer includes a first node and a second node. In some embodiments, the output of the first node of the output layer is an estimated heat load, and an output of the second node of the output layer is an estimated effective temperature.

Training of the neural network may be performed, using back-propagation, off-line, e.g., when the storage system is manufactured, or at other times (e.g., during scheduled maintenance) when the storage system is not responding to input and output commands from an external host. During training of the neural network, various combinations of flash operations (or "nonvolatile memory operations") may be performed, and the temperature of the SSD may be monitored, to allow the neural network to form a model of the relationship between different kinds of flash operations and the temperature. An estimated thermal mass for the SSD may then be used to infer a heat load and/or an effective temperature corresponding to various flash operations. In this manner, the storage system may use deep learning in each SSD to build a mapping between workload and temperature to report temperature significantly earlier than a physical thermal sensor is capable of. As a result, the storage system may be configured to pre-cool the enclosure 120 and the SSDs 110 before a significant temperature change occurs.

Once calculated according to one of the methods described above, the heat load estimates may be combined with the temperature sensor readings of all of the SSDs in a controller implemented in the baseboard management controller 140, to generate one or more fan speed commands that may then be used to set fan speeds. In some embodiments, a multiple input multiple output linear controller (implemented for example as a multiple input multiple output infinite impulse response filter) may be used to generate a plurality of fan speed commands from the set of inputs (i.e., from the heat load estimates and the temperature sensor readings). The multiple input multiple output linear controller may be a multiple input multiple output proportional integral differential (PID) controller, or it may be a plurality of single input single output PID controllers.

Figure 5A:
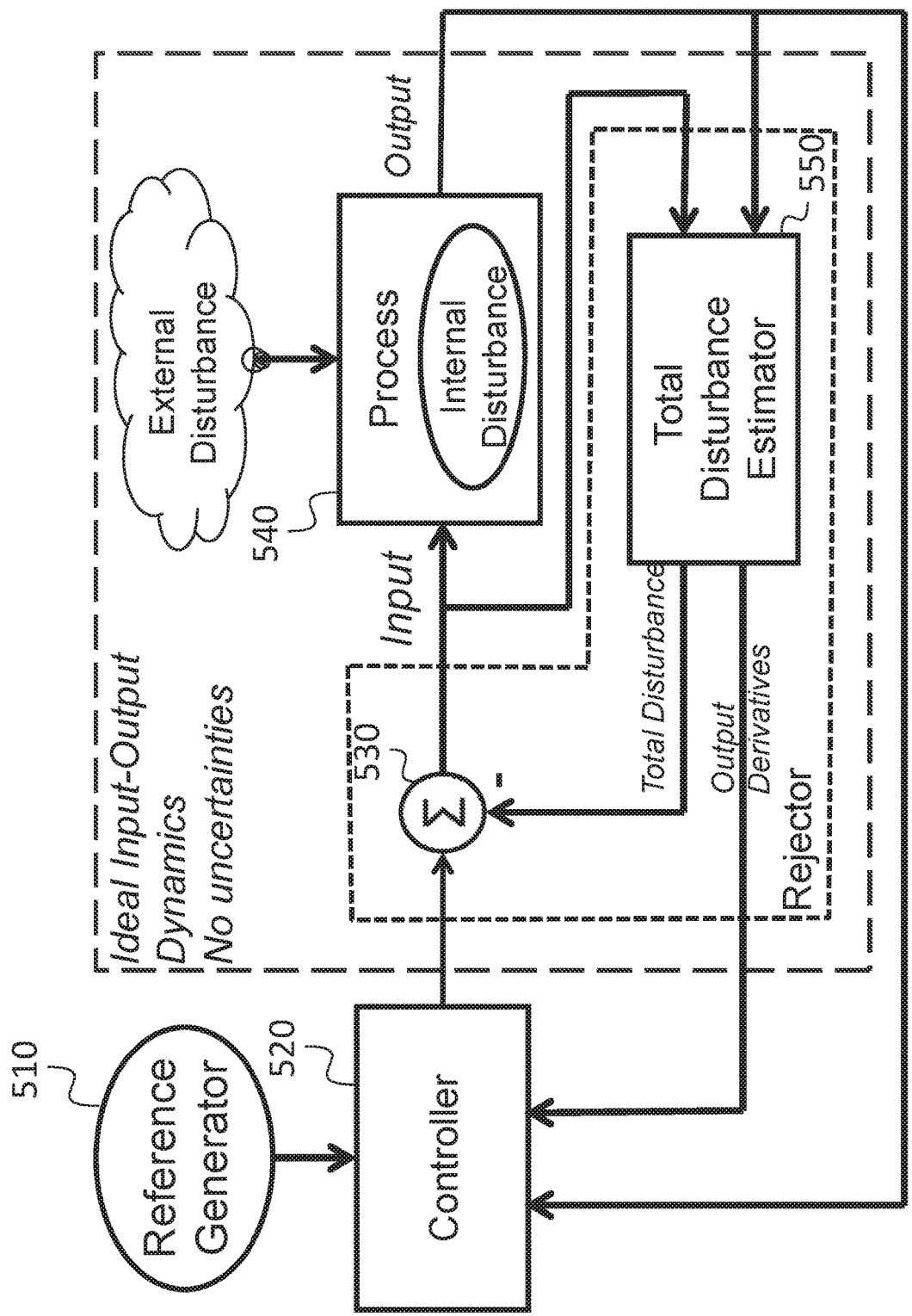
FIG. 5A is a block diagram of a system employing active disturbance rejection control, according to an embodiment of the present invention.

Referring to FIG. 5A, in other embodiments, better performance may be achieved using active disturbance rejection control (ADRC). In some embodiments, an active disturbance rejection control system may include a reference generator 510 connected to a controller 520, connected to a summation block 530; the summation block 530 may provide control inputs to the process (or "plant") 540 being controlled. A total disturbance estimator 550 may receive as inputs both the control inputs supplied to the process 540 and the outputs of the process 540, and generate estimates of total disturbance and output derivatives.

In some embodiments, active disturbance rejection control is a robust control method that is based on extension of the system model with an additional and fictitious state variable, representing everything that the system designer does not include in the mathematical description of the plant (or process). This virtual state (sum of internal and external disturbances, usually denoted as a "total disturbance") is estimated online with a state observer and used in the control signal in order to decouple the system from the actual perturbation acting on the plant. This disturbance rejection feature allows a system designer to treat the considered system with a simpler model, since the negative effects of modeling uncertainty are compensated in real time. As a result, the system designer may not need a precise analytical description of the plant, as the system designer can assume the unknown parts of dynamics as the internal disturbance in the plant. In some embodiments, the concept of active disturbance rejection control is very intuitive: it single mindedly focuses on disturbance rejection as the central task and the "active" part comes from mitigating the disturbance before it runs its course. As a result, the active disturbance rejection control system may compensate the disturbance ahead of time rather than reacting to error signals, as a PID controller, for example, may do.

Figure 5B:
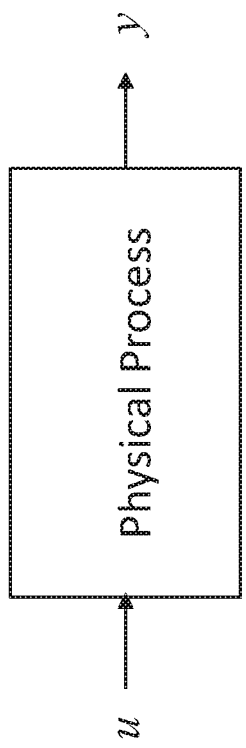
FIG. 5B is a block diagram of a physical process model employed in active disturbance rejection control, according to an embodiment of the present invention.

Referring to FIG. 5B, in some embodiments active disturbance rejection control may reformulate the problem of uncertainty, illustrated for example for a physical process with an input u and an output y. The system of FIG. 5B may be modeled by the equation of FIG. 5C, which includes the total disturbance, both internal and external. The total disturbance may be estimated and canceled. Defining $f(y, \dot{y}, d, t)=(-\alpha_1\dot{y}-\alpha_0 y+d)$ (the internal disturbance) and substituting into the equation of FIG. 5C then results in the expression of FIG. 5D, and, using the equation of FIG. 5E and the approximation of FIG. 5F, the result of FIG. 5G may be obtained. An extended state observer may then be defined according to the equations of FIGS. 5H and 5I. The extended state observer may be included in the total disturbance estimator 550.

Figure 6:
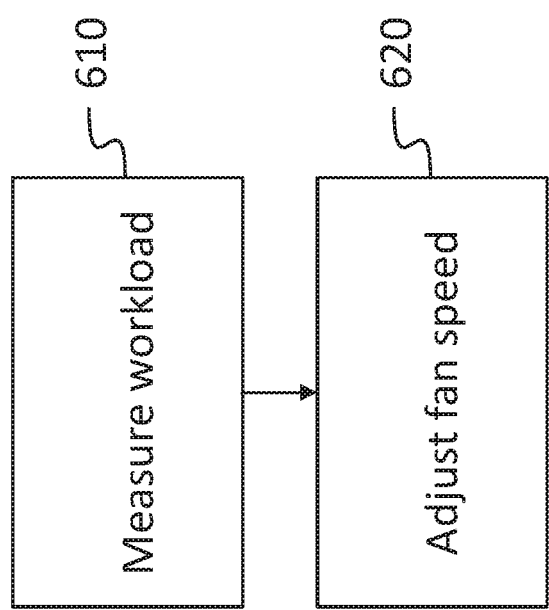
FIG. 6 is a flow chart of a method for temperature control, according to an embodiment of the present invention.

Referring to FIG. 6, in some embodiments a method for controlling a temperature of a storage system including a plurality of storage devices includes measuring, in an act 610, a workload of one or more of the storage devices, and adjusting, in an act 620, a speed of a cooling fan based (e.g., directly based) on the measured workload.

In some embodiments the adjustment of the speed of the cooling fans is based only on the estimated workload and not on the directly measured temperatures of the SSDs 110 (e.g., the temperatures measured by the temperature sensors 240) to provide more proactive feedback control.

In view of the foregoing, some embodiments provide a storage system with temperature control. The system includes a plurality of storage devices such as solid state drives, a system controller such as a baseboard management controller, and one or more cooling fans. Each storage devices includes a controller configured to estimate the heat load in the storage device and/or an effective temperature, resulting from operations performed in the storage device. The system controller employs active disturbance rejection control to adjust the fan speed based on the estimated heat loads, the estimated temperatures, and/or the sensed internal temperatures, of the storage devices.

The SSD controller in each SSD, and the baseboard management controller 140 may each be a processing circuit. The term "processing circuit" (or "processing means") is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for thermal control for SSDs have been specifically described and illustrated herein, many modifications and variations will be apparent to those skilled in the art. Accordingly, it is to be understood that a system and method for thermal control for SSDs constructed according to principles of this invention may be embodied other than as specifically described herein. The invention is also defined in the following claims, and equivalents thereof

What is claimed is:

1. A storage system, comprising:
    first and second storage devices; and
    a system management processing circuit configured to:
        measure a workload of one or more storage devices from among the first and second storage devices by monitoring storage operation commands received by the one or more storage devices, the workload corresponding to a rate of storage operations executed by the one or more storage devices; and
        adjust a temperature based on the measured workload.

2. The storage system of claim 1, wherein the rate is based, at least in part, on a number of storage operations per unit time executed by the one or more storage devices.

3. The storage system of claim 1, wherein the rate is based, at least in part, on a weighted average of different storage operations executed by the one or more storage devices, weights being applied according to an amount of energy that the storage operations dissipate in the one or more storage devices.

4. The storage system of claim 1, wherein the storage operations includes at least one of a read operation, a write operation, or an erase operation.

5. The storage system of claim 1, wherein one or more of the first and second storage devices comprises a storage device processing circuit, configured with the system management processing circuit to adjust the temperature based on the measured workload.

6. The storage system of claim 5, wherein the storage device processing circuit of the first storage device is configured to estimate a power dissipated in the first storage device.

7. The storage system of claim 6, wherein the storage device processing circuit of the first storage device is configured to estimate an effective temperature in the first storage device.

8. The storage system of claim 7, wherein the storage device processing circuit of the first storage device is configured to implement an artificial neural network, the artificial neural network being configured to receive information regarding a rate at which nonvolatile memory operations are performed in the first storage device, and to estimate the effective temperature in the first storage device.

9. The storage system of claim 8, wherein the artificial neural network comprises a plurality of output nodes, and an output of a first output node is an estimated heat load and an output of a second output node is an estimated effective temperature.

10. The storage system of claim 8, wherein the system management processing circuit is configured to receive first and second estimated effective temperatures, including the estimated effective temperature in the first storage device, and to generate, based on the first and second estimated effective temperatures, first and second control commands to adjust the temperature.

11. The storage system of claim 10, wherein the first and second control commands correspond to fan speed commands.

12. The storage system of claim 1, wherein one or more of the first and second storage devices is a solid state drive.

13. A method for operating a storage system, the storage system comprising:
    first and second storage devices; and
    a system management processing circuit,
    the method comprising:
        measuring a workload of one or more storage devices from among the first and second storage devices by monitoring storage operation commands received by the one or more storage devices, the workload corresponding to a rate of storage operations executed by the one or more storage devices; and
        adjusting a temperature based on the measured workload.

14. The method of claim 13, wherein the rate is based, at least in part, on a number of storage operations per unit time executed by the one or more storage devices.

15. The method of claim 13, wherein the rate is based, at least in part, on a weighted average of different storage operations executed by the one or more storage devices, weights being applied according to an amount of energy that each kind of the storage operations dissipates in the one or more storage devices.

16. The method of claim 13, wherein the storage operations includes at least one of a read operation, a write operation, or an erase operation.

17. A method for operating a storage system, the storage system comprising:
    first and second storage devices; and
    a system management processing circuit,
    the method comprising:
        measuring a workload of one or more storage devices from among the first and second storage devices, the workload corresponding to a rate of storage operations executed by the one or more storage devices; and
        adjusting a temperature based on the measured workload,
    wherein the adjusting of the temperature comprises:
        estimating, utilizing a neural network, a heat load corresponding to the measured workload;
        estimating an effective temperature of a storage device from among the first and second storage devices; and generating a control command utilizing active disturbance rejection control to adjust the temperature.

18. The method of claim 17, wherein the control command corresponds to a fan speed command.

19. The method of claim 17, further comprising training the neural network while the storage system is offline.

20. The method of claim 19, wherein the training comprises:
   executing, by one or more of the first and second storage devices, different storage operations;
   monitoring a temperature of the one or more of the first and second storage devices executing the different storage operations; and
   generating a mapping of a relationship between the different storage operations and the temperature.

* * * * *